United States Patent [19]

Freeman

[11] Patent Number: 5,023,206

[45] Date of Patent: Jun. 11, 1991

[54] SEMICONDUCTOR DEVICE WITH ADJACENT NON-OXIDE LAYERS AND THE FABRICATION THEREOF

[75] Inventor: Dean W. Freeman, San Diego, Calif.

[73] Assignee: Texas Instruments Incorporated, Dallas, Tex.

[21] Appl. No.: 133,757

[22] Filed: Dec. 16, 1987

[51] Int. Cl.⁵ .................... H01L 21/00; H01L 21/02; C23C 15/00
[52] U.S. Cl. .................... 437/228; 437/235; 437/238; 437/239; 156/625; 156/646; 156/653; 148/DIG. 17
[58] Field of Search ................ 148/DIG. 17

[56] References Cited

U.S. PATENT DOCUMENTS 4,579,609 4/1986 Reif et al. ........................... 437/170
4,605,479 8/1986 Faith, Jr. ......................... 204/192.17

OTHER PUBLICATIONS

Sze, S. VLSI Technology, Chapter 3, pp. 93–94, McGraw-Hill, 1983.
Vossen, J., Preparation of Surfaces for High Quality Interface Formation, J. Vac. Sci. Tech. A2(2), Jun. 1984, pp. 212–215.

Primary Examiner—Brian E. Hearn
Assistant Examiner—B. Everhart
Attorney, Agent, or Firm—Douglas A. Sorensen; James T. Comfort; Melvin Sharp

[57] ABSTRACT

A semiconductor device is disclosed in which a deposited non-oxide layer (44) overlies and physically contacts another non-oxide layer (38) so that no intervening oxide layer is present. The device is fabricated by performing an insitu etch and deposition process. In one embodiment, the device (36) is sealed in a LPCVD chamber (10) and etched using gaseous anhydrous hydrofluoric acid to remove an oxide (40) from one non-oxide layer (38). Then, without exposing the device to a water rinse or to the atmosphere, a chemical vapor deposition process applies the deposited layer (44) upon the other layer (38).

12 Claims, 1 Drawing Sheet

SEMICONDUCTOR DEVICE WITH ADJACENT NON-OXIDE LAYERS AND THE FABRICATION THEREOF

TECHNICAL FIELD OF THE INVENTION

The present invention relates in general to semiconductor devices and the fabrication thereof. Specifically, the present invention relates to a semiconductor device having adjacent non-oxide layers without an intervening oxide layer and the fabrication of such a device.

BACKGROUND OF THE INVENTION

In the fabrication of semiconductor devices, it is occasionally desirable to deposit one non-oxide layer upon another non-oxide layer. For example, a bipolar transistor may be fabricated having an emitter area with a polycrystalline silicon layer overlying a monocrystalline layer. Although such a structure may occasionally be schematically illustrated or modeled as having one non-oxide layer physically contacting the other non-oxide layer, conventional structures actually possess an undesirable, thin native oxide layer interposed between the two non-oxide layers.

Although semiconductor devices having such native oxide layers embedded therein may function satisfactorily, it would nevertheless be desirable to eliminate such native oxide layers. One problem of particular concern in connection with such embedded native oxide layers centers around controlling the thickness of the native oxide layer. The factors which cause the native oxide layer to grow are difficult to control in the fabrication of semiconductor devices. Thus, the native oxide layers tend to vary in thickness from batch to batch. Device parameters sometimes exhibit an undesirable variance between batches as a consequence of the native oxide thickness variance. For example, variance in an intervening native oxide layer thickness at the emitter region of a bipolar transistor may cause gain variance between batches of transistors.

Conventional techniques of etching oxides fail to adequately prevent the occurrence of such native oxide layers. One conventional oxide etching technique represents a wet etch in which a semiconductor body having, for example, a silicon surface layer is immersed in a liquid etchant, such as hydrous hydrofluoric acid, then subjected to deionized water rinses. Next, the semiconductor body is placed in an environment where a non-oxide layer may be deposited overlying the silicon layer.

Regardless of whether the wet etchant effectively removes all oxides present at the silicon surface, the water rinses promote growth of oxides on the silicon surface. In addition, conventional processing and handling techniques expose the silicon layer to the atmosphere; and consequently, such techniques promote further oxide growth on the silicon layer. A 10–30 angstrom native oxide layer thus typically grows overlying the silicon layer before a deposition process deposits a non-oxide layer which will prevent further oxide growth at the silicon layer surface. Hence, the silicon and deposited non-oxide layers do not generally physically contact one another. Rather, each one physically contacts the intervening native oxide layer.

Alternative conventional oxide etching techniques utilize gaseous etchants at atmospheric pressure in a chamber designed for such etching or at low pressure. However, such techniques represent only etching techniques and they fail to contemplate the deposition of a non-oxide layer upon the silicon surface. These etching techniques require an etched body to be subjected to a water rinse or to an oxide-forming process in which a catalyst mask is stripped away. Moreover, they require an etched body to be exposed to the atmosphere while being transported to a deposition chamber. Accordingly, such etching techniques do nothing to prevent native oxide formation on the silicon layer. The deposited non-oxide layer therefore physically contacts a native oxide layer rather than a silicon layer. Accordingly, the industry has a need for a device which does not have a native oxide layer between adjacent non-oxide layers and a method for fabricating such a device.

SUMMARY OF THE INVENTION

Accordingly, it is an advantage of the present invention that a semiconductor device is provided in which one non-oxide layer is deposited upon another non-oxide layer without an intervening native oxide layer.

Another advantage of the present invention is that a method of depositing a non-oxide layer on a non-oxide surface is provided with insitu etching to remove oxides from the surface and to prevent native oxide formation.

The above and other advantages of the present invention are carried out in one form by a semiconductor device in which a deposited, first non-oxide layer overlies a second non-oxide layer so that the first and second non-oxide layers physically contact one another.

In another aspect of the present invention, one form of a process deposits a second layer upon a first layer of a body so that no intervening oxide layer forms. The process encloses the body in a sealed chamber and introduces a gaseous etchant into the chamber to remove oxides which may be present on the first layer. The chamber is purged of the gaseous etchant and a substance which forms the second layer upon contact with the first layer is introduced into the chamber. The body is then removed from the chamber.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

DETAILED DESCRIPTION

Figure 1:
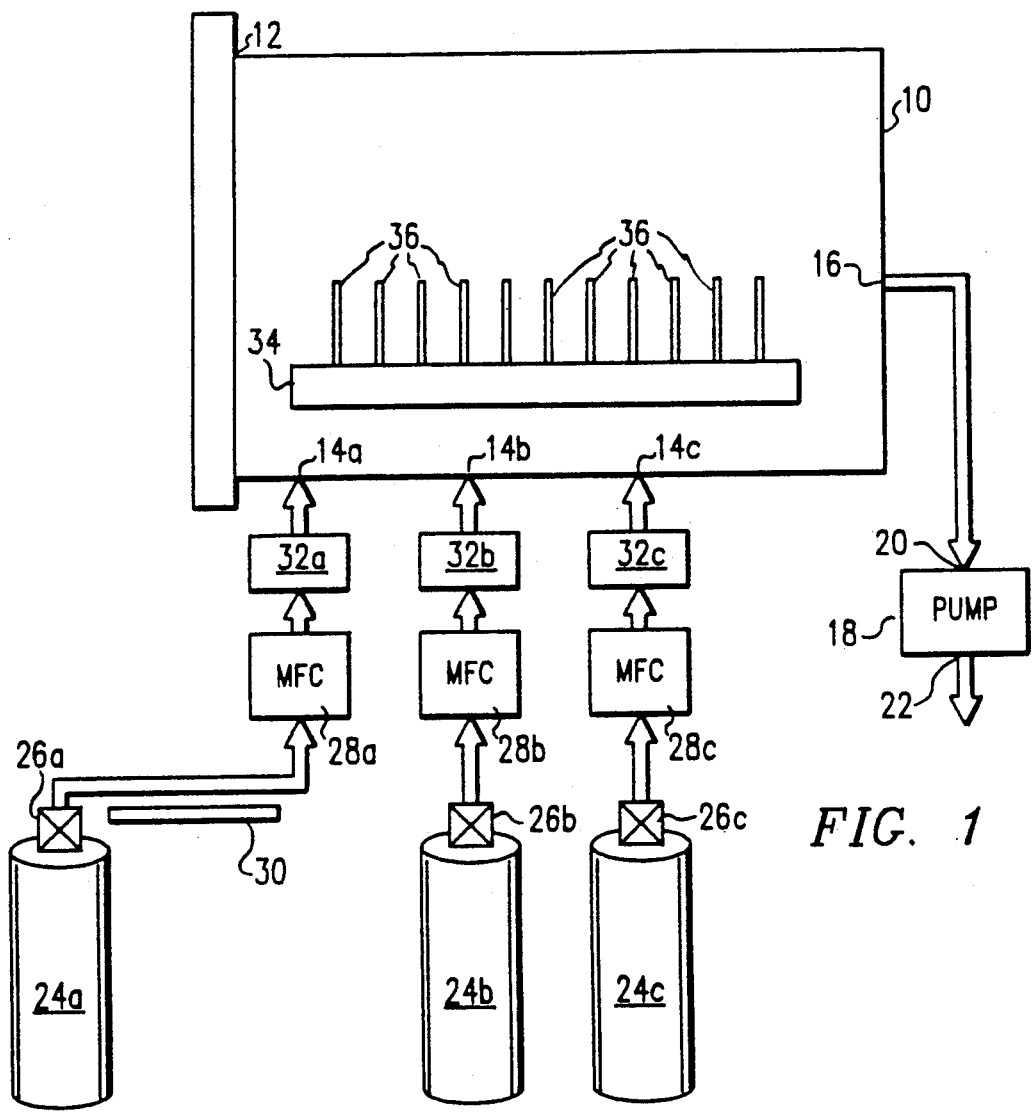
FIG. 1 schematically illustrates equipment used to fabricate the present invention.

FIG. 1 illustrates one example of an equipment set-up utilized in the fabrication of the present invention. Accordingly, FIG. 1 shows a chamber or furnace 10 in which the present invention is fabricated. In this preferred embodiment, chamber 10 is a conventional low pressure chemical vapor deposition (LPCVD) reactor which is well known to those skilled in the art. Chamber 10 includes a door 12 which may be tightly sealed so that chamber 10 may maintain a relatively large pressure differential between the interior and the exterior of chamber 10. In addition, chamber 10 includes inputs 14a-14c and an exhaust 16. Gaseous substances enter chamber 10 at inputs 14a-14c and leave chamber 10 at exhaust 16.

A pump 18 has a low pressure input 20 which couples to exhaust 16 of chamber 10. In addition, pump 18 has a high pressure output 22. The operation of pump 18 causes gases within chamber 10 to exit chamber 10 at exhaust 16. When nothing enters chamber 10 at input 14 while pump 18 operates, the interior of chamber 10 experiences a low pressure compared to the exterior of chamber 10. An ultimate pressure, which represents the lowest achievable pressure within chamber 10, of around 30-40 mtorr may be achieved.

FIG. 1 additionally shows gas sources 24a, 24b, and 24c coupled through valves 26a, 26b, and 26c, to inputs of mass flow controllers 28a, 28b, and 28c, respectively. Gas sources 24a-24c typically represent bottles containing different substances in a compressed gaseous state. Specifically, gas source 24a may advantageously contain an etchant, such a anhydrous hydrofluoric acid, gas source 24b may contain an inert gas, such as nitrogen or argon or the like, and gas sourced 24c may contain silane or another substance which those skilled in the art may utilize for deposition of a non-oxide layer within a semiconductor device. In addition, a heat strip 30 may advantageously be applied to the coupling between valve 26a and mass flow controller 28a to counteract cooling and liquefaction of the etchant from gas source 24a caused by adibatic expansion across valve 26a.

Mass flow controllers 28a-28c control the amount of gases flowing therethrough so that the pressure of chamber 10 may be maintained within relatively constant levels. Resultingly, predictable and repeatable concentrations of gases are established within chamber 10.

Outputs of mass flow controllers 28a, 28b, and 28c couple to inputs of Teflon membrane filters 32a, 32b, and 32c, respectively, and outputs of filters 32a, 32b, and 32c couple to inputs 14a, 14b, and 14c, respectively, of chamber 10. Filters 32a-32c clean the gases flowing therethrough into chamber 10 so that cleaner etched surfaces with less residue residing thereon result.

A conventional quartz boat 34 resides centrally located within chamber 10. Boat 34 holds semiconductor bodies or wafers 36 in an upright spaced apart position with in chamber 10 so that the gases in chamber 10 may freely circulate around wafers 36. Wafers 36 may be characterized as having a non-oxide layer, such as a monocrystalline silicon layer, at or near a surface of wafer 36 at the point in processing depicted by FIG. 1. Furthermore, it will be understood by those skilled in the art that wafers 36 include the substrates upon which semiconductor devices, such as bipolar transistors, are built.

Figure 2:
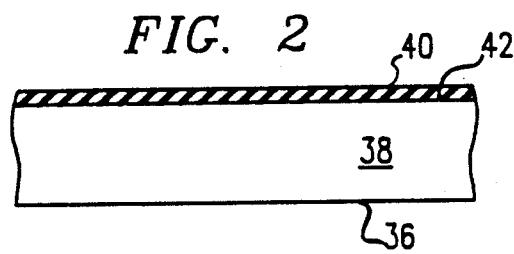
FIG. 2 shows a cross-sectional side view of the present invention at a first stage of its fabrication.

FIG. 2 shows a cross-sectional side view of a portion of a single wafer 36. FIG. 2 depicts, for example, an emitter portion of a bipolar transistor or another section of a semiconductor device in which it is desired to deposit a non-oxide layer directly upon and in physical contact with a non-oxide layer 38 of wafer 36. In the bipolar transistor example, non-oxide layer 38 may represent a monocrystalline silicon layer. In addition, FIG. 2 shows an oxide layer 40 which overlies layer 38 at a boundary surface 42 of layer 38 and which must be removed so that a subsequently applied non-oxide layer may physically contact layer 38.

Oxide layer 40 may represent a native oxide layer which has been unintentionally formed in prior processing steps by rinsing wafer 36 in water or by exposing wafer 36 to oxygen in the atmosphere. Such a native oxide layer would typically be less than 50 angstroms thick. Alternatively, oxide layer 40 may represent an intentionally grown or deposited oxide layer which may be several thousands angstroms thick. Thus, the portion of wafer 36 depicted in FIG. 2 may represent a section of wafer 36 over which a previously applied mask (not shown) permits the etching of oxide layer 40.

According to a preferred process for fabricating the present invention, wafer 36 as shown in FIG. 2 is enclosed in chamber 10 (see FIG. 1) so that chamber 10 becomes sealed. Then, through the operation of pump 18, (see FIG. 1) the pressure in chamber 10 is lowered to an ultimate pressure. The lowering of pressure within chamber 10 removes a large quantity of atmosphere from the interior of chamber 10, thereby lowering the concentration of oxygen within chamber 10 and greatly retarding further oxidation of layer 38. Next, the interior of chamber 10 is flushed with an inert gas from gas source 24b (see FIG. 1) to remove additional remaining oxygen and other contaminants from the system. For example, chamber 10 may be flushed with nitrogen at around 100 standard cubic centimeters per minute for greater than five minutes.

Figure 3:
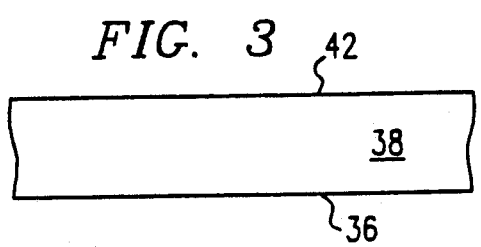
FIG. 3 shows a cross-sectional side view of the present invention at a second stage of its fabrication.

FIG. 3 illustrates the results of an etching operation which removes oxide layer 40 from non-oxide layer 38. According to a preferred embodiment of the present invention, anhydrous hydroflouric acid in a gaseous state is introduce into chamber 10 from gas source 24a (see FIG. 1) to etch oxide layer 40 (see FIG. 2). The etching chemical reaction which removes oxide layer 40 may be characterized by:

$$SiO_2 + 4HF \rightarrow SiF_4 + 2H_2O.$$

As known to those skilled in the art, this chemical reaction takes places over a wide range of temperatures and other environmental conditions. Accordingly, some degree of etching takes place without precisely controlling the temperature and pressure of chamber 10. However, in order to ensure a reliable and repeatable interface between a subsequently applied non-oxide layer and non-oxide layer 38, the present invention desires to achieve a complete and thorough etching of oxide layer 40 without significant etching of non-oxide layer 38 and without leaving a harmful amount of by-product residues on surface 42 of layer 38.

Accordingly, the preferred process of the present invention controls the temperature and pressure ranges within which the etching chemical reaction takes place. For example, the temperature of chamber 10 is maintained at greater than 100° C. so that water generated by the etching chemical reaction will vaporize and be driven away from surface 42 of layer 38, rather than remain on surface 42 of layer 38 to cause spotting and subsequent oxide formation. In addition, the temperature of chamber 10 is preferably maintained at less than 400° C., and more preferably, at less than 200° C., so that when silicon represents non-oxide layer 38 no substantial etching of silicon occurs.

In addition, the preferred process of the present invention maintains the pressure within chamber 10 at greater than 100 torr so that a sufficient concentration of anhydrous hydrofluoric acid exists within chamber 10 to evenly etch oxide 40 from layer 38. On the other hand, it is preferable according to the present invention to maintain the pressure of chamber 10 at less than one atmosphere so that no more etchant resides within chamber 10 than is minimally needed to etch oxide layer 40. The use of a minimal concentration of etchant tends to lessen the amount of by-products produced by the etching chemical reaction so that surface 42 of non-oxide layer 38 remains as clean as possible and water rinses of wafer 36 are not necessary after the etching of oxide layer 40. In addition, the use of a minimal concentration of etchant prevents waste of the etchant and eases disposal problems of the etchant after it has been used and exhausted from chamber 10.

Still further, the present invention continually pumps etchant through chamber 10 while maintaining the above mentioned pressures and temperatures. In other words clean etchant is continually being introduced at input 14a of chamber 10 while used etchant along with etching reaction by-products are being exhausted at exhaust 16 of chamber 10 (See FIG. 1). Accordingly, due to the maintaining of temperature above 100° C., the use of a minimal concentration of etchant, and the pumping of the system during the etching chemical reaction, the etched surface remains as clean as possible so that a subsequent rinse step is not required.

In addition, moisture may advantageously be introduced into chamber 10 during the period in which the etching chemical reaction takes place. Water may speed the etching chemical reaction and promote a consistent, even etch of oxide layer 40 because water tends to free up fluorine atoms from an anhydrous hydrofluoric acid etchant so that the fluorine may attack oxide layer 40. However, once etching has begun, the etching chemical reaction produces water within chamber 10. An excessive quantity of introduced moisture may tend to contaminate surface 42 of layer 36. Thus, only a small, well controlled quantity of moisture is desired. This small quantity of moisture may be introduced into chamber 10 by passing nitrogen gas through a water bubbler to an input of chamber 10 (not shown) or by utilizing a steam vaporizer in connection with a mass flow controller coupled to an input of chamber 10 (not shown).

The present invention continues the etching process until substantially all of oxide layer 40 has been etched away. The amount of time required for this etching varies depending upon the thickness of oxide layer 40 and the temperature of chamber 10. However, empirical studies have shown that several thousand angstroms of oxide layer 40 may be cleared at temperatures of less than 200° C. in approximately one minute.

After the etching of oxide layer 40 from non-oxide layer 38, the structure shown in FIG. 3 remains. Next, the preferred process purges the etchant from the system by pumping chamber 10 down to an ultimate pressure, then flushing the system with an inert gas, such as nitrogen, at a pressure of 100–200 mtorr for greater than approximately five minutes.

Accordingly, at this point in the process non-oxide layer 38 does not contain a substantial oxide layer thereon, and the present invention maintains wafer 36 in an environment which substantially prevents growth of a native oxide on surface layer 42 of layer 38. Such an environment consists of maintaining wafer 36 within chamber 10 so that wafer 36 is not exposed to the atmosphere or to water rinses, each of which cause oxide growth. It will be understood by those skilled in the art that small quantities of etching residue (not shown) such as a mono fluoride film may still reside on surface 42 of layer 38. Nevertheless, such residue has been minimized by the above-discussed process so that a subsequently-applied non-oxide layer is substantially in physical contact with non-oxide layer 38.

Figure 4:
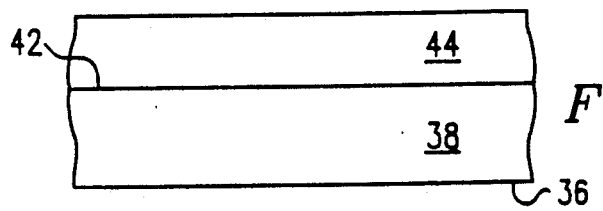
FIG. 4 shows a cross-sectional side view of the present invention at a third stage of its fabrication.

FIG. 4 illustrates the results of introducing a gaseous substance into chamber 10 so that a non-oxide layer 44 is deposited on non-oxide layer 38. A conventional low pressure chemical vapor deposition process may be used to deposit layer 44. The gaseous substance introduced into chamber 10 forms layer 44 upon contact with wafer 36. Such substances are well known to those skilled in the art.

For example, if FIG. 4 depicts the emitter area of a bipolar transistor, then non-oxide layer 38 typically represents a monocrystalline silicon layer and layer 44 represents a polycrystalline silicon layer. To apply a polycrystalline silicon layer 44 upon layer 38, the temperature of chamber 10 is ramped up to a temperature of greater than 580° C. if a crystalline form of polycrystalline silicon is desired or less than 580° C. if polycrystalline silicon in an amorphous form is desired. This ramping of temperature may occur simultaneously with the purging of etchants from chamber 10, discussed above, in order to save processing time.

Next, silane may be introduced into chamber 10 from gaseous source 24c at input 14c at a concentration in which pressure within chamber 10 is conventionally less than one torr to accomplish the deposition of layer 44 on layer 38. The duration for which silane is applied to chamber 10 depends upon the desired thickness of polycrystalline silicon layer 44. After the application of layer 44, wafer 36 may be removed from chamber 10 because layer 44 seals surface 42 between layers 44 and 38 to prevent further oxide growth at surface 42.

In summary, a semiconductor device is formed in which one non-oxide layer resides adjacent to and substantially in physical contact with another non-oxide layer without an intervening native oxide layer. This structure results because a preferred process for manufacturing the present invention performs an insitu etch and chemical vapor deposition process within a single chamber without exposing semiconductor bodies to oxide-forming rinses or to the atmosphere.

The foregoing description uses a preferred embodiment to illustrate the present invention. However, those skilled in the art will recognize that changes and modifications may be made in this embodiment without departing from the scope of the present invention. For example, the above description discussed the deposition of a polycrystalline silicon layer upon a monocrystalline silicon layer. However, an alternative embodiment may deposit a silicon nitride layer upon a silicon layer without an intervening oxide layer. In addition, particular chamber temperature and pressure parameters may experience a wide degree of variation without fundamentally altering the present invention. These and other modifications obvious to those skilled in the art are intended to be included within the scope of this invention.

What is claimed is:

1. A method of depositing a layer upon a surface of a non-oxide body, said depositing occurring substantially without formation of an intervening oxide layer, said method comprising the steps of:
   enclosing the body in a sealed chamber;
   introducing a gaseous etchant into the chamber so that if oxides are present at the body surface, the etchant substantially removes the oxides, while maintaining the temperature of said chamber at grater than 100 degrees Celsius so that water generated by the etching of oxides will vaporize and be driven away from the body surface;

purging the etchant from the chamber;

raising the temperature of the chamber after the step of introducing the gaseous etchant;

after raising the temperature of the chamber, introducing a substance into the chamber which forms the layer upon contact with the body; and thereafter removing the body from the chamber.

2. A method as claimed in claim 1 wherein:

the body surface is silicon; and said introducing a gaseous etchant step comprises the step of using anhydrous hydrofluoric acid as the etchant.

3. A method as claimed in claim 2 wherein, during said step of introducing a gaseous etchant, the temperature of the chamber is maintained at less than 400° C. to prevent substantial etching of the body surface.

4. A method as claimed in claim 2 wherein said introducing a gaseous etchant step comprises the step of maintaining a chamber pressure of greater than 100 torr to control concentration of the anhydrous hydroflouric acid in the chamber.

5. A method as claimed in claim 4 additionally comprising, simultaneously with said introducing a gaseous etchant step, the step of removing by-products generated by etching oxides within the chamber.

6. A method as claimed in claim 4 wherein said maintaining step comprises the step of maintaining chamber pressure at a pressure of less than one atmosphere.

7. A method as claimed in claim 1 additionally comprising, prior to said introducing a gaseous etchant step, the step of establishing an ultimate pressure in the chamber to remove oxygen from the chamber.

8. A method as claimed in claim 1 additionally comprising, prior to said introducing a gaseous etchant step, the step of flushing the chamber with an inert gas to remove oxygen from the chamber.

9. A method as claimed in claim 8 and additionally comprising, prior to said introducing a gaseous etchant step, the step of establishing an ultimate pressure in the chamber to remove oxygen from the chamber.

10. A method as claimed in claim 1 wherein said step of raising the temperature of the chamber is performed simultaneously with said purging step.

11. A method as claimed in claim 1 additionally comprising the step of completing said purging step prior to said introducing a gaseous substance step.

12. A method of depositing a non-oxide layer upon a surface of a silicon layer without formation of an intervening oxide layer, said method comprising the steps of:

enclosing the silicon layer in a chamber;

lowering pressure in the chamber to remove oxygen from the chamber;

introducing a gaseous anhydrous hydrofluoric acid etchant into the chamber so that if oxides are present at the silicon layer surface, the etchant substantially removes the oxides;

maintaining, during said introducing an etchant step, temperature of the chamber at greater than 100° C. and less than 400° C.;

maintaining, during said introducing an etchant step, a chamber pressure of greater than 100 torr to control concentration of the etchant in the chamber;

removing by-products generated by etching oxides;

purging the etchant from the chamber;

raising the temperature of the chamber, after said introducing an etchant step;

introducing a gaseous substance into the chamber which forms the non-oxide layer upon contact with the silicon layer; and removing the non-oxide and silicon layers from the chamber.

* * * * *